United States Patent
Busky

(10) Patent No.: US 6,528,798 B1
(45) Date of Patent: Mar. 4, 2003

(54) TECHNIQUE FOR MANUFACTURING AN ELECTROSTATIC ELEMENT FOR STEERING A CHARGED PARTICLE BEAM

(75) Inventor: Michael R. Busky, Concord, MA (US)

(73) Assignee: Schlumberger Technologies Inc., San Jose, CA (US)

( * ) Notice: Subject to any disclaimer, the term of this patent is extended or adjusted under 35 U.S.C. 154(b) by 247 days.

(21) Appl. No.: 09/717,663

(22) Filed: Nov. 21, 2000

(51) Int. Cl.⁷ .......................... H01J 49/42; G01K 1/08; B23H 7/10
(52) U.S. Cl. ................. 250/396 R; 250/400; 219/69.12
(58) Field of Search ............................ 250/396 R, 281, 250/290, 400; 29/458; 219/69.12

(56) References Cited

U.S. PATENT DOCUMENTS

| | | | | |
|---|---|---|---|---|
| 3,378,918 A | * | 4/1968 | Closset | ........................ 29/423 |
| 4,117,321 A | * | 9/1978 | Meyer | ......................... 250/281 |
| 4,870,283 A | * | 9/1989 | Taya | .......................... 250/290 |
| 5,241,182 A | * | 8/1993 | Martin et al. | ............ 250/396 R |
| 5,373,157 A | * | 12/1994 | Hiroki et al. | ................ 250/281 |
| 5,852,270 A | * | 12/1998 | Holkeboer | ............... 219/69.12 |
| 6,125,522 A | * | 10/2000 | Nakasuji | ...................... 29/458 |
| 6,191,419 B1 | * | 2/2001 | Sinha | ......................... 250/294 |
| 6,239,429 B1 | * | 5/2001 | Blessing et al. | ............ 250/281 |

* cited by examiner

*Primary Examiner*—Jack Berman
*Assistant Examiner*—K. Fernandez
(74) *Attorney, Agent, or Firm*—Cohen, Pontani, Lieberman & Pavane

(57) ABSTRACT

A process for manufacturing an electrostatic element for steering a charged particle beam. A cylindrical, non-conductive body having a bore therethrough is assembled with a cylindrical, conductive core also having a bore therethrough and sized to fit within the bore of the body. The core is secured within the bore of the body, and then longitudinally extending slots are cut completely through the core to create pole pieces that are electrically isolated from each other.

11 Claims, 2 Drawing Sheets

TECHNIQUE FOR MANUFACTURING AN ELECTROSTATIC ELEMENT FOR STEERING A CHARGED PARTICLE BEAM

FIELD OF THE INVENTION

The present invention is directed to the manufacture of an electrostatic element for steering a charged particle beam and, in particular, to facilitating the manufacturing process and providing an improved product.

BACKGROUND OF THE INVENTION

Various instruments are known which rely on interaction of charged particles emitted from a sample to derive characteristics of the sample. Examples of such instruments are an electron microscope and a focused ion beam microscope.

For facilitating the description of the present invention, it will be explained in connection with a scanning electron microscope ("SEM"). However, it should be understood that the invention is not limited to an SEM and can be applied by one with ordinary skill in the art to other instruments and machines that require a focused beam of charged particles.

An SEM operates by generating a primary scanning electron beam that impacts a sample, a surface of which is being imaged. As a result, backscattered and secondary electrons are emitted from the sample surface and collected by a detector which is arranged near the surface of the sample. The detector generates a signal from the electron emission collected from the sample surface as it is exposed to the electron beam. The signal from the detector is used to display an image of the surface on a video screen.

On its way between the electron source and the sample, the beam is deflected by various electromagnetic and electrostatic elements that are used to, for example, align, focus and scan the beam, as well as correct its shape. All the elements that deflect the beam from one path to another, for whatever purpose, are referred to herein as steering elements. The present invention is particularly directed to a steering element of the electrostatic type.

Prior art electrostatic steering elements have a cylindrical body made of a material which must be an electrical insulator and non-magnetic. The body is formed with a center bore. For an octopole element in common use, eight small, metallic pole pieces are individually inserted into the bore and fixed in place. This approach has several drawbacks. The entire process is labor intensive and time consuming because all eight pole pieces are manufactured as separate parts, and these must be individually affixed to the body. Also, it is very difficult with this approach to achieve precise alignment of the small pole pieces with respect to each other and with respect to the body. A positional error for any pole piece will cause aberrations in the electrostatic field created by the element and resultant inaccuracies in steering the electron beam. Since the pole pieces must be equidistantly spaced from each other, a slight positional error in placing any one of the pole pieces relative to the body will be carried through when aligning subsequent pole pieces with the misaligned pole piece. Thus, because of the tight available space within the bore, it may not be possible to insert the final pole piece in accurate alignment relative to the other pole pieces. In fact, it may not be possible to insert the final pole piece at all. In addition, because the metal used for the pole pieces, such as copper, is subject to oxidation, the pole pieces have to be covered with a non-magnetic coating, such as rhodium. However, due to the required non-linear shape of the slots between adjacent pole pieces, it is difficult to completely coat the pole pieces at the deep end portion of the slots.

SUMMARY OF THE INVENTION

One object of the invention is to provide an improved technique for manufacturing an electrostatic steering element for a charged particle beam.

Another object of the present invention is to manufacture an electrostatic steering element for a charged particle beam with less labor and high accuracy.

A further object of the present invention is to manufacture an electrostatic steering element for a charged particle beam without having to coat the pole elements to prevent oxidation.

Yet another object of the present invention is to manufacture an electrostatic steering element for a charged particle beam which is rugged and robust so that it is not subject to misalignment during handling.

These and other objects are attained in accordance with one aspect of the invention directed to a process for manufacturing an electrostatic element for steering a charged particle beam which provides a cylindrical, non-conductive body having a bore therethrough, and also a cylindrical, conductive core having a bore therethrough and sized to fit within the bore of the body. The core is secured within the bore of the body, and longitudinally extending slots are cut completely through the core to create pole pieces that are electrically isolated from each other.

DETAILED DESCRIPTION OF THE DRAWINGS

Figure 1:
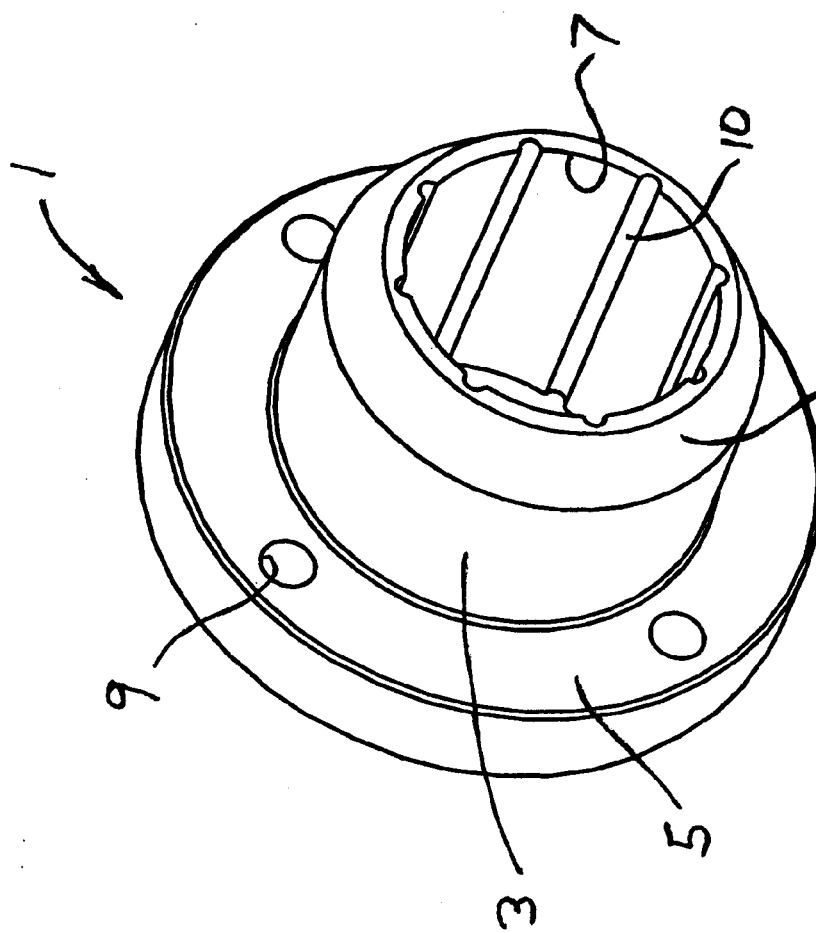
FIG. 1 is a perspective view of the-body for an electrostatic steering element in accordance with the present invention.

FIG. 1 shows body 1 as having a boss 3 and a flange 5. Body 1 can be tapered at end 2, depending on the need for a close fit with other components in the particular apparatus in which it is installed. Extending completely through the body 1 is a central bore 7. Holes 9 in the flange are used for mounting purposes. The wall of bore 7 has axially extending grooves 10 formed therein which run the entire combined lengths of the body, for reasons explained in detail below. The material forming body 1 is selected with several requirements in mind. In particular, the material must be an electrical insulator, non-magnetic, easily machinable to close tolerances, and structurally sound. Since the manufacturing process involves brazing, as explained below, the material must be capable of withstanding high temperatures and be thermally stable. A preferred material which satisfies these criteria is Alumina, which is readily available material. Body 1 can be manufactured from a cylindrical tube of Alumina which is machined down to the required dimensions of the particular electrostatic steering element.

Figure 2:
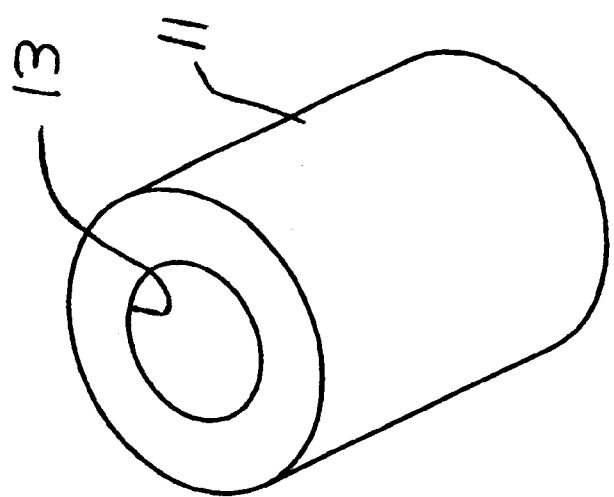
FIG. 2 is a perspective view of the core used for forming the pole pieces of an electrostatic steering element in accordance with the present invention.

FIG. 2 shows a cylindrical core 11 sized to fit within bore 7 of body 1. The core 11 has an outer diameter which is sized relative to bore 7 to enable brazing of the core to the body 1. A bore 13 is formed in core 11. Bore 13 is undersized to allow for machining after the brazing step is completed. The length of core 11 is at least the same length as that of body 1, depending on the desired operational characteristics of the particular electrostatic steering element. Core 11 is preferably formed of platinum, which is a non-oxidizing metal and, therefore, it need not be coated to prevent oxidation, unlike the prior art steering elements described above.

Bore 7 of body 1 is pre-coated with a brazing alloy flux, and then core 11 is inserted into bore 7. The two components are then brazed to each other in a vacuum oven.

After core 11 is brazed into position within body 1, top surface 6 of flange 5 is machined to attain flatness so that body 1 is level with core 11. A boring step is then carried out to properly size bore 13 of core 11 and to make it concentric with the periphery of the body 1. Without this step, it is possible for variations to occur with respect to concentricity because there is some movement between core 11 and bore 7 during the brazing step. Since the assembly is positioned in the column by its mounting flange, this variation in concentricity would also produce some undesirable non-uniformity in the spacing of the pole pieces from the beam axis.

Figure 4:
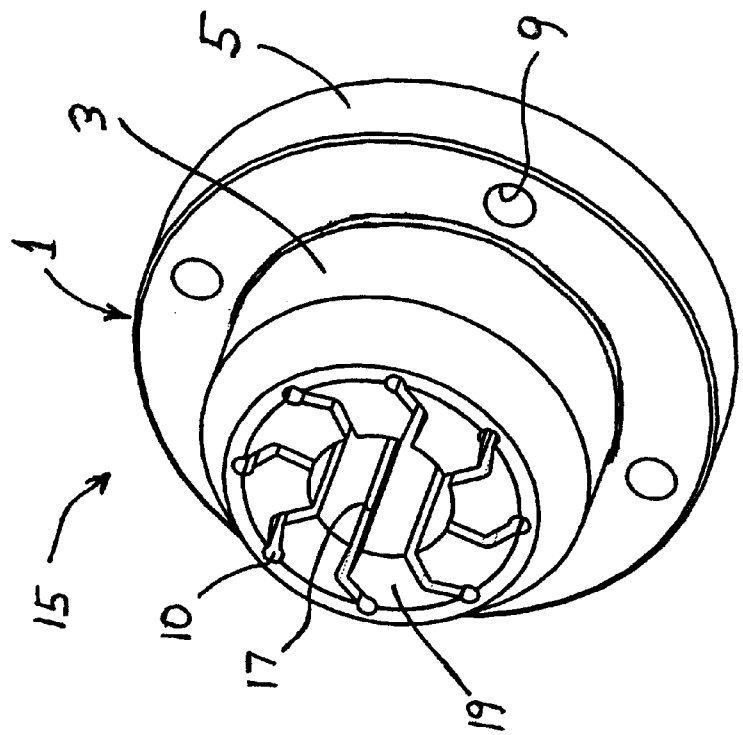
FIG. 4 is a perspective bottom view of the electrostatic steering element of FIG. 3.
Figure 3:
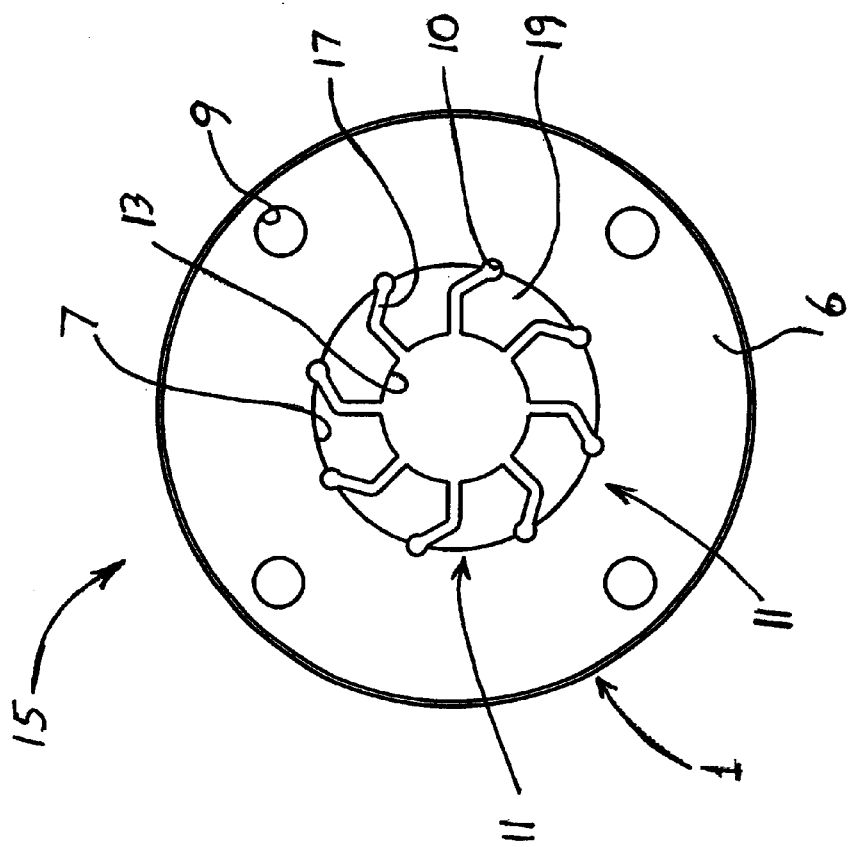
FIG. 3 is a top view of an assembled electrostatic steering element in accordance with the present invention.

The brazed assembly of core 11 and body 1 is placed in a wire electrical discharge machine ("EDM"). This is a well known type of metal cutting machine. The wire EDM is used to cut nonlinear slots 17 through core 11 to create eight pole pieces 19, as shown in FIGS. 3 and 4. The non-linear shape of slots 17 is mandated by the need to prevent exposure of the charged particle beam to an insulating surface on body 1 that can become statically charged because this would create an undesirable electric field which could affect the beam. The wire EDM is capable of forming slots 17 with the required accuracy. Thus, the present invention replaces the laborious individual handling of eight pole pieces with the much simpler handling of one core. Also, the drawback of having to accurately position and secure eight pole pieces individually is replaced with just the single positioning step of placing core 11 in body 1, and the accurate, automated formation of the pole pieces by cutting the slots 17 with a wire EDM.

It is essential for the pole pieces to be completely isolated from one another by having slots 17 pass all the way through core 11. However, due to the nature of how a wire EDM operates, a thin remnant of the core may be left between the pole pieces at the end of the slots where they terminate adjacent to the body 1. In order to avoid any possibility that pole pieces remain in contact with each other after formation of slots 17 by the wire EDM has been completed, a post-grinding step is carried out with a suitable, well known grinding machine. The provision of grooves 10 in body 1, as shown in FIG. 1, assists with this post grinding step. Without grooves 10, the core 11 and body 1 would be in contact. The joint line between these two materials with different strengths would cause the grinding machine to not cut in a straight line. The tool would "walk" into the weaker material (platinum) and cause tool breakage.

Although a preferred embodiment of the present invention has been described in detail above, various modifications thereto will be readily apparent to anyone with ordinary skill in the art. All such variations are intended to fall within the scope of the present invention as defined by the following claims.

I claim:

1. A process for manufacturing an electrostatic element for steering a charged particle beam, comprising:

providing a cylindrical, non-conductive body having a bore therethrough;

providing a cylindrical, conductive core having a bore therethrough and sized to fit within the bore of said body;

securing said core within the bore of said body; and cutting longitudinally extending slots completely through said core to create pole pieces that are electrically isolated it from each other.

2. The process of claim 1, wherein said core is secured within the bore of said body by brazing.

3. The process of claim 1, wherein said body is made of Alumina.

4. The process of claim 1, wherein said step of cutting slots is performed with a wire electrostatic discharge machine.

5. The process of claim 4, wherein said cutting step comprises, after completion of cutting with the wire electrostatic discharge machine, further cutting the end of each of said slots to cut each of said slots completely through said core.

6. The process of claim 1, wherein said core is metal.

7. The process of claim 6, wherein said metal core is platinum.

8. The process of claim 1, comprising further boring said bore in the core after the core has been secured to said body to make the bore in the core concentric with the outer periphery of said body.

9. The process of claim 8, wherein the step of further boring said bore in the core after the core has been secured to said body sizes the bore to a predetermined bore size.

10. The process of claim 1, wherein said bore in the body is provided with longitudinally extending grooves corresponding in number to the number of said slots.

11. The process of claim 10, wherein said grooves are aligned with the ends of said slots, respectively, and said cutting step comprises, after completion of cutting with the wire electrostatic discharge machine, further cutting the end of each of said slots to cut each of said slots completely through said core to communicate with said grooves.

* * * * *